(12) United States Patent
Kim

(10) Patent No.: US 7,032,509 B2
(45) Date of Patent: Apr. 25, 2006

(54) APPARATUS AND METHOD OF FABRICATING ELECTRO LUMINESCENCE DISPLAY DEVICE

(75) Inventor: Kyung Man Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 247 days.

(21) Appl. No.: 10/699,741

(22) Filed: Nov. 4, 2003

(65) Prior Publication Data

US 2004/0121696 A1     Jun. 24, 2004

(30) Foreign Application Priority Data

Dec. 20, 2002   (KR) ............... 10-2002-0082009

(51) Int. Cl.
*B41M 1/14*     (2006.01)
*H01J 9/24*     (2006.01)
*B41F 13/10*    (2006.01)

(52) U.S. Cl. ................. 101/211; 101/491; 427/66; 445/24

(58) Field of Classification Search ........... 101/211, 101/174, 212, 216, 395, 491, 483; 427/66, 427/67, 68; 445/24, 60; 315/169.3
See application file for complete search history.

(56) References Cited

U.S. PATENT DOCUMENTS

| | | | |
|---|---|---|---|
| 6,582,504 B1 * | 6/2003 | Fujita ..................... | 106/311 |
| 2002/0047560 A1 * | 4/2002 | Lee et al. ............... | 315/169.3 |
| 2004/0124781 A1 * | 7/2004 | Bae et al. ............... | 315/169.3 |

* cited by examiner

*Primary Examiner*—Leslie J. Evanisko
(74) *Attorney, Agent, or Firm*—McKenna Long & Aldridge LLP (57) ABSTRACT

There is disclosed a fabricating apparatus and method of an electro luminescence display device that is adaptive for preventing organic EL material from flowing over adjacent pixels. A fabricating apparatus of an electro luminescence display device according to an embodiment of the present invention includes a print roller on which an organic material is spread in order to form a light emission layer corresponding to a pixel pattern on a substrate; and a concave-convex pattern attached to the print roller and formed to have a width of about 20~90% of a pitch of the pixel pattern with a designated gap therebetween.

9 Claims, 12 Drawing Sheets

APPARATUS AND METHOD OF FABRICATING ELECTRO LUMINESCENCE DISPLAY DEVICE

This application claims the benefit of the Korean Patent Application No. P02-082009 filed on Dec. 20, 2002, which is hereby incorporated by reference for all purposes as if fully set forth herein.

BACKGROUND OF THE INVENTION

1. Field of the Invention

The present invention relates to an electro luminescence display device, and more particularly to a fabricating apparatus and method of fabricating an electro luminescence display device that is adaptive for preventing organic EL material from flowing over adjacent pixels.

2. Discussion of the Related Art

Recently, there have been developed various flat panel displays having reduced weight and bulk, which overcomes a major disadvantage of a cathode ray tube CRT display. Such flat panel displays include a liquid crystal display LCD, a field emission display FED, a plasma display panel PDP, and electro luminescence EL display device. There is active research to increase the display quality and the screen size of the flat panel displays.

Among these, the structure and fabricating process of the PDP is relatively simple, thus the PDP is most advantageous to be made light in weight and large in size. However, the light emission efficiency and brightness of PDPs is low and their power dissipation is high. Compared to PDPs, it is difficult to make an LCD, in which a thin film transistor TFT is used as a switching device, large in size because of the associated semiconductor process. But, because LCDs are mainly used as display devices for notebook computers, the demand for them has increased. However, the LCD has a disadvantage that the power dissipation is high because the LCD requires a backlight unit. Further, the LCD has a characteristic that there is high light loss caused by optical devices such as a polarizing filter, a prism sheet, and a diffusion panel, etc. Moreover, the viewing angle of LCDs is narrow.

As compared with this, the EL display device is generally classified into an inorganic EL and an organic EL in accordance with the material of a light-emission layer. The EL display device being a self-luminous device has an advantage that its response speed is fast, its light-emission efficiency and brightness are high, and it has wide viewing angle.

Figure 1:
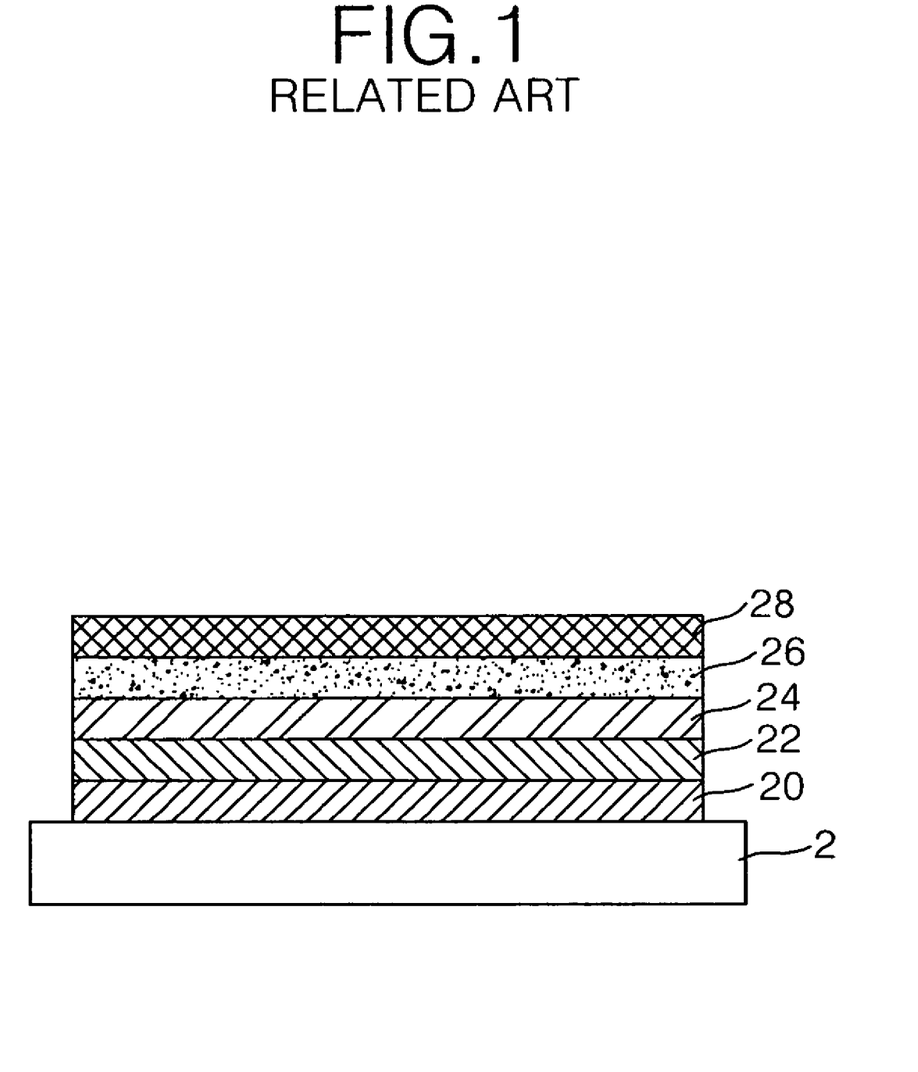
FIG. 1 is a sectional diagram representing an electro luminescence display device of the related art.

The organic EL display device, as illustrated in FIG. 1, has an anode electrode 20 formed with a transparent electrode pattern on a substrate 2 and includes a hole injection layer 22, a light emission layer 24, an electron injection layer 26, and a cathode 28. The cathode electrode 28 is formed on the electron injection layer 26 and is a metal electrode.

If a drive voltage is applied to the anode electrode 20 and the cathode electrode 28, holes in the hole injection layer 22 and electrons in the electron injection layer 26 each progress toward the light emission layer 24 to excite a fluorescent material within the light emission layer 24. In this way, a picture or an image is displayed with visible light generated from the light emission layer 24.

In the organic EL display device, a small-molecule organic EL material is patterned by a vacuum deposition and a high polymer organic EL material is patterned by a coating method using an inkjet spray head or a printing system.

Among the methods of fabrication, a fabricating apparatus of the high polymer organic EL will be explained in conjunction with FIG. 2.

Figure 2:
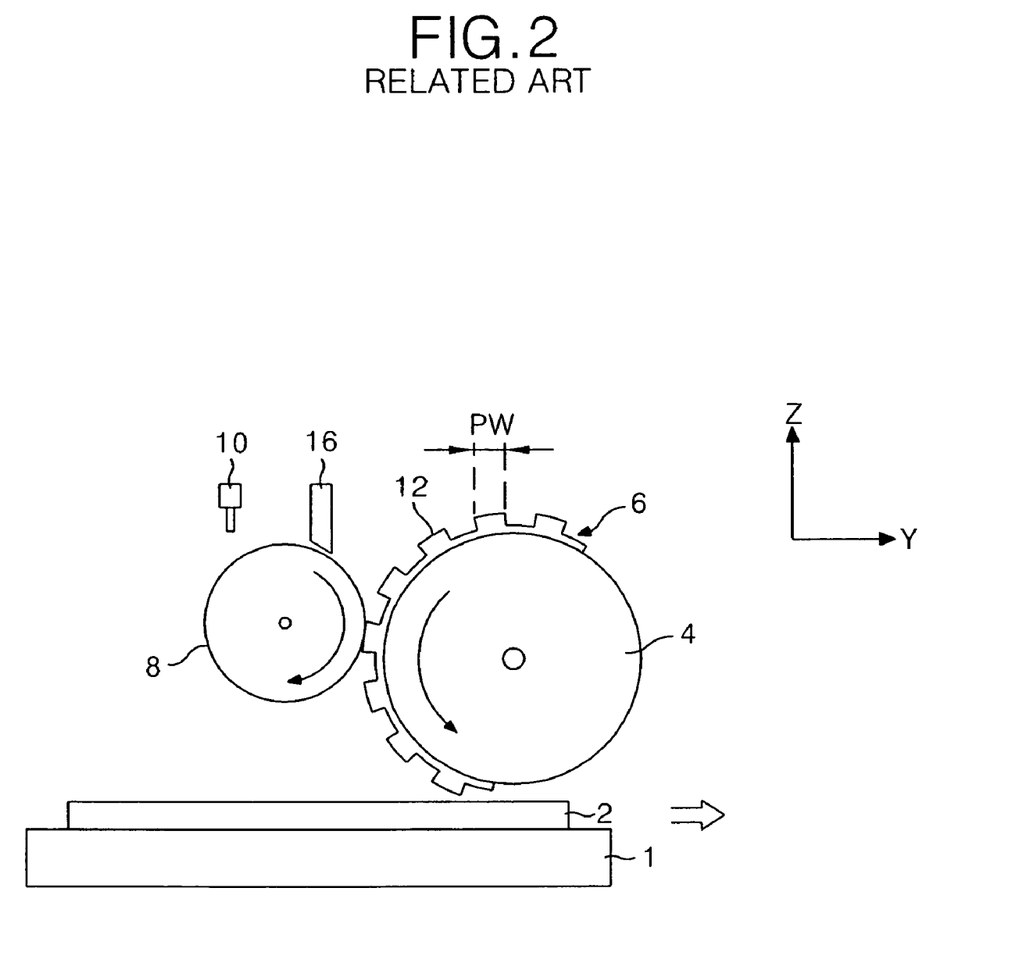
FIG. 2 is a diagram representing a fabricating apparatus of an electro luminescence display device of the related art.

Referring to FIG. 2, the fabricating apparatus of the high polymer organic EL according to the related art includes a supply roller 8 on which an EL material is spread, a print roller 4 to which a resin plate 6 for transferring the EL material spread on the surface of the supply roller 8 is attached, and a substrate 2 loaded under the print roller 4.

Each of red R, green G and blue B EL materials is dropped on the supply roller 8 from a dispenser 10 installed above the supply roller 8. The supply roller 8 is configured to be able to rotate in contact with the resin plate 6 attached to the print roller 4, and acts to spread the EL material dispensed onto it from the dispenser 10 onto the resin plate 6. A blade 16 or a roller is provided close to the surface of the supply roller 8 for the EL material applied to the resin plate 6 to be spread uniformly.

The print roller 4 causes the EL material from the supply roller 8 to be spread on a concave-convex pattern 12 of the resin plate 6 by rotational motion. Further, the print roller 4 causes the concave-convex pattern 12 of the resin plate 6, on which the EL material is spread, to be in contact with the substrate 2 by rotational motion, thereby forming the EL pattern on the substrate 2.

Figure 3:
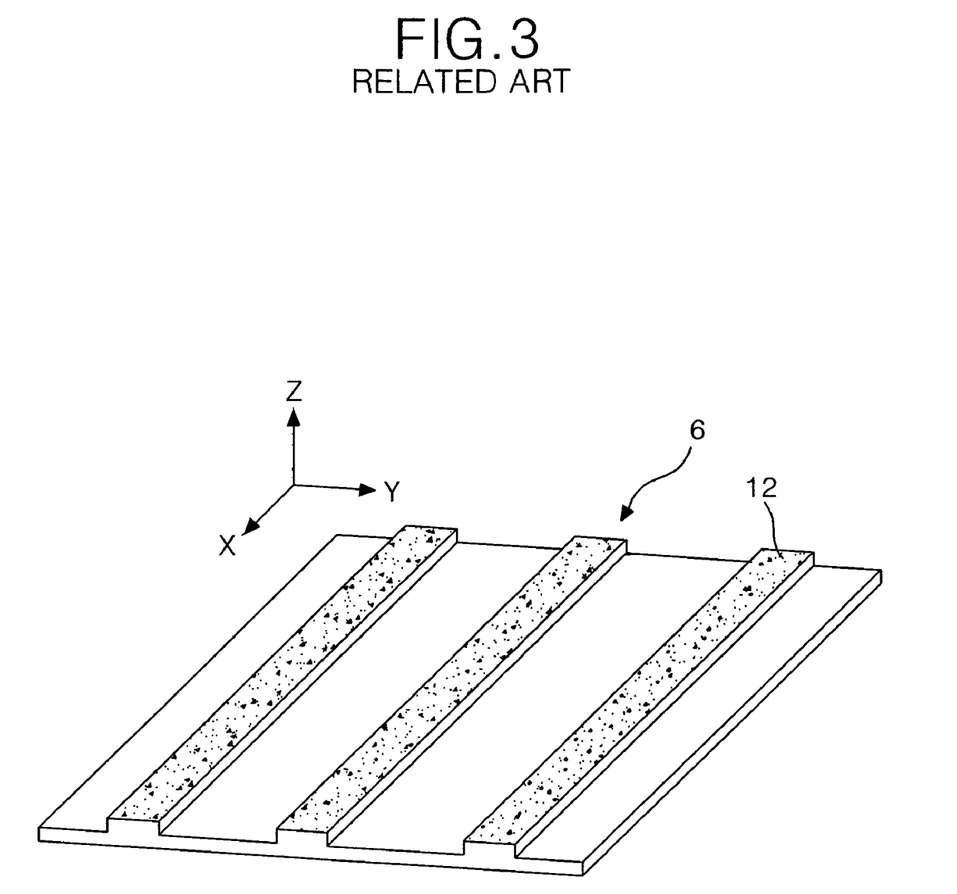
FIG. 3 is a perspective view representing a resin plate illustrated in FIG. 2 in detail.
Figure 4:
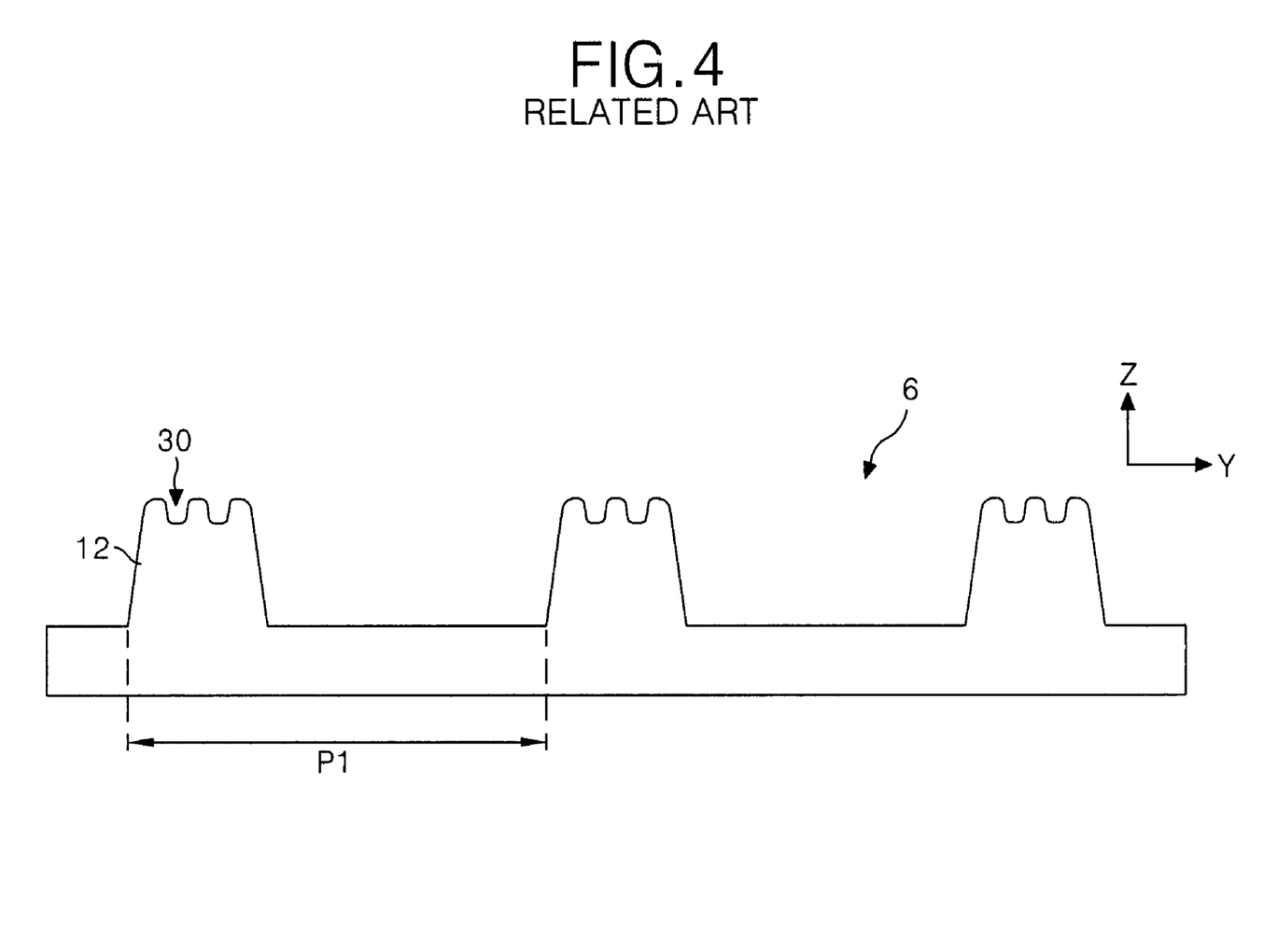
FIG. 4 is a sectional view representing a concave-convex pattern shown in FIG. 3 in detail.

In the resin plate 6, there is formed a concave-convex pattern 12 that has the same shape as the pixel formed on the substrate 2 and has a designated width PW. The concave-convex pattern 12, as illustrated in FIGS. 3 and 4, is projected in a stripe shape with a designated gap therebetween. On the surface of the concave-convex pattern 12, there are formed a plurality of hemispherical shape grooves 30, as illustrated in FIG. 4. The concave-convex pattern 12 is contacted with the supply roller 8 on which the EL material is spread, so the EL material is uniformly spread on the concave-convex pattern 12 with a designated thickness to be transferred onto the substrate 2.

Referring again to FIG. 2, a print table 1 having the substrate 2, which is to be printed, placed is loaded by a loading device (not shown) below the print roller 4. Herein, the substrate 2 can have an electrode pattern and various material layers formed thereon for an EL display device configuration.

To describe the operation of the fabricating apparatus of the high polymer organic EL display device of the related art, the loading device (not shown) loads the substrate 2 that is placed on the print table 1. If the substrate 2 is loaded, the EL material is applied from the dispenser 10 and spread on the surface of the supply roller 8. The spread EL material is placed in the concave-convex pattern 12 of the resin plate 6 as the print roller 4 rotates. The EL material placed in the concave-convex pattern 12 is fired to form the EL pattern on the substrate 2 after being dropped on the corresponding substrate 2. After forming the EL pattern of a specific color, the same method is used to form EL patterns of other colors.

In the method of forming the EL pattern on the substrate 2 using the print roller 4, the spread of the organic EL material is accelerated right after printing as the wetting and leveling characteristics of the organic EL material are greater. As a result, the organic EL material formed on the substrate 2 is over-spread to the adjacent pixels to deteriorate color purity. In order to solve such a problem, as illustrated in FIG. 5, barrier ribs 18 are formed to reduce the spread of the organic EL material over the adjacent pixels.

Figure 5:
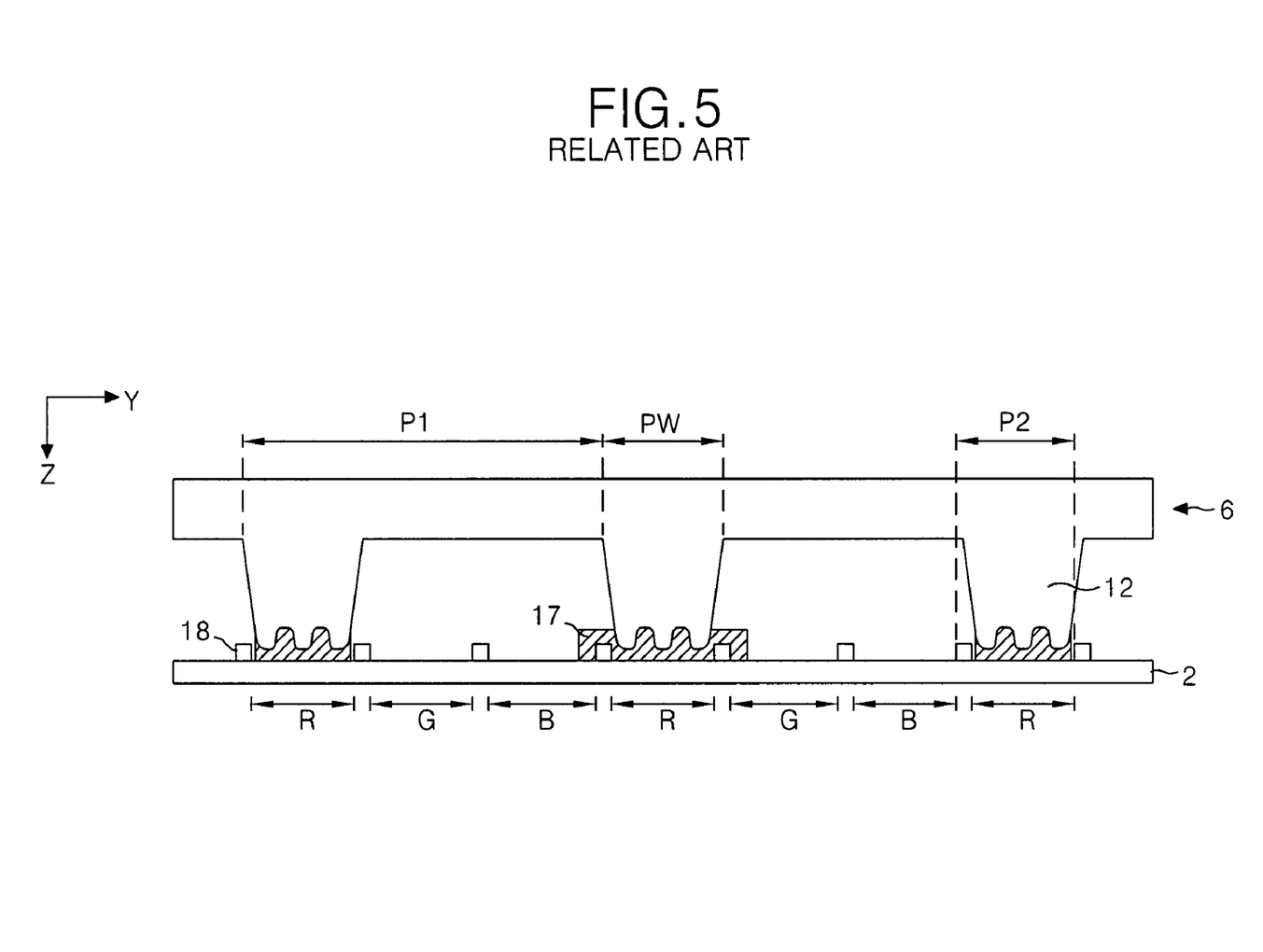
FIG. 5 is a sectional view representing a process of transferring an organic EL material to a substrate using the concave-convex pattern shown in FIG. 3.
Figure 6:
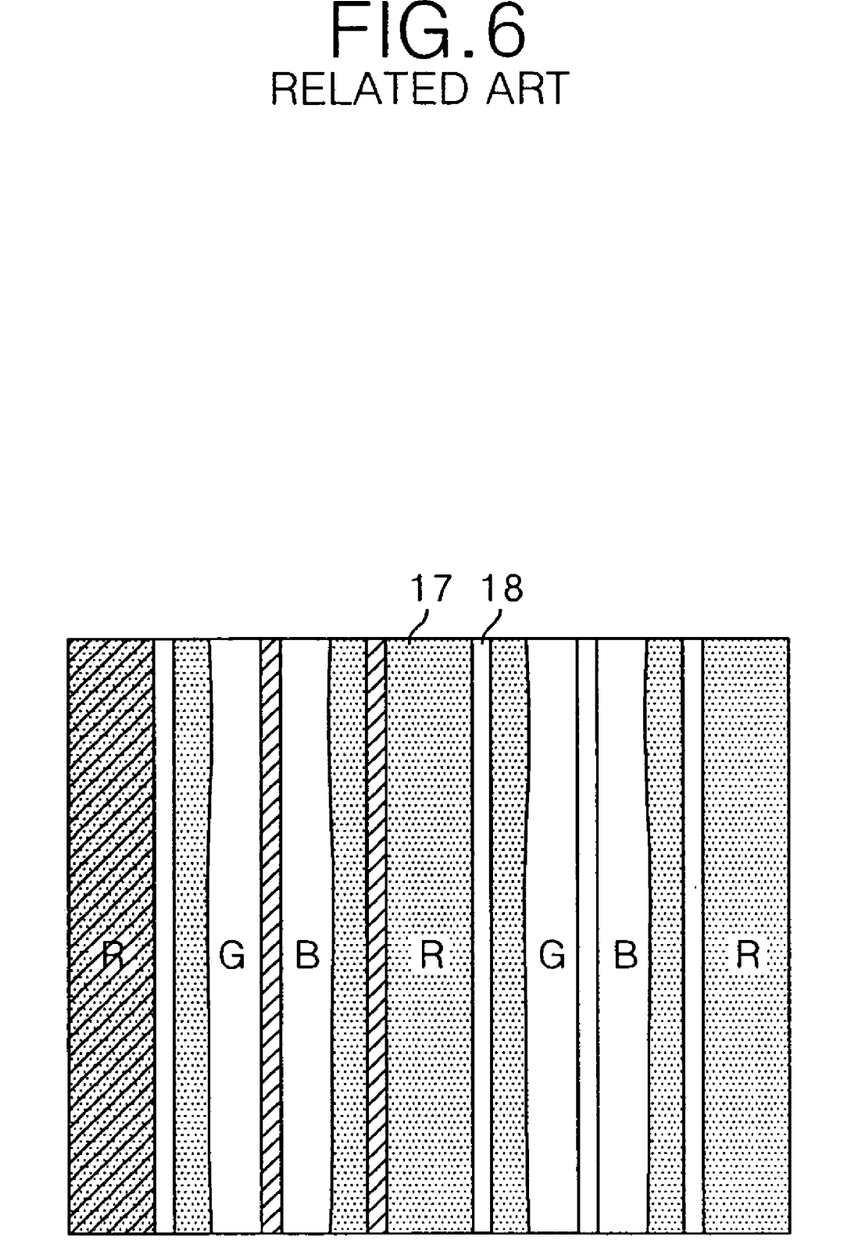
FIG. 6 is a diagram representing a pixel pattern formed on a substrate an electro luminescence display device of the related art.

However, when the organic EL material spread on the concave-convex pattern, which has a width of about 90% or more with respect to the pitch P2 of one pixel, is transferred to the substrate 2, the organic EL material 17, as illustrated in FIGS. 5 and 6, flows over the adjacent pixels to deteriorate the color purity because the gap between the barrier ribs 18 and both ends of the concave-convex pattern 12 is narrow and there is the organic EL material 17 therebetween.

SUMMARY OF THE INVENTION

Accordingly, the present invention is directed to an apparatus and method of fabricating an electroluminescence display device that substantially obviates one or more of the problems due to limitations and disadvantages of the related art.

Accordingly, it is an advantage of the present invention to provide a fabricating apparatus and method of an electro luminescence display device that is adaptive for preventing organic EL material from flowing over adjacent pixels.

In order to achieve these and other advantages of the invention, a fabricating apparatus of an electro luminescence display device according to an aspect of the present invention includes a print roller on which an organic material is spread in order to form a light emission layer corresponding to a pixel pattern on a substrate; and a concave-convex pattern attached to the print roller and formed to have a width of about 20~90% of a pitch of the pixel pattern with a designated gap therebetween.

The width of the concave-convex pattern is about 40~60% of the pitch of the pixel pattern.

There are formed a plurality of minute grooves on the surface of the concave-convex pattern.

The print roller includes a supply roller to supply the light-emitting material to the print roller.

The fabricating apparatus further includes barrier ribs formed on the substrate to partition off the pixel patterns.

A fabricating method of an electro luminescence display device according to another aspect of the present invention includes a first step of adhering a resin plate to a rotating roller, the resin plate has a projected concave-convex pattern that has a width of 20~90% with respect to a pitch of a pixel pattern which is to be formed on a substrate; a second step of applying an organic material to the resin plate; and a third step of printing on the substrate the organic material spread on the resin plate that rotates by the roller.

In the fabricating method, the width of the concave-convex pattern is about 40~60% of the pitch of the pixel pattern.

The fabricating method further includes forming barrier ribs on the substrate to partition off the pixel patterns.

In the fabricating method, light emission layers of red, green and blue are formed on the substrate by repeating the first to third steps.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENT

Reference will now be made in detail to embodiments of the present invention, examples of which are illustrated in the accompanying drawings.

Figure 7:
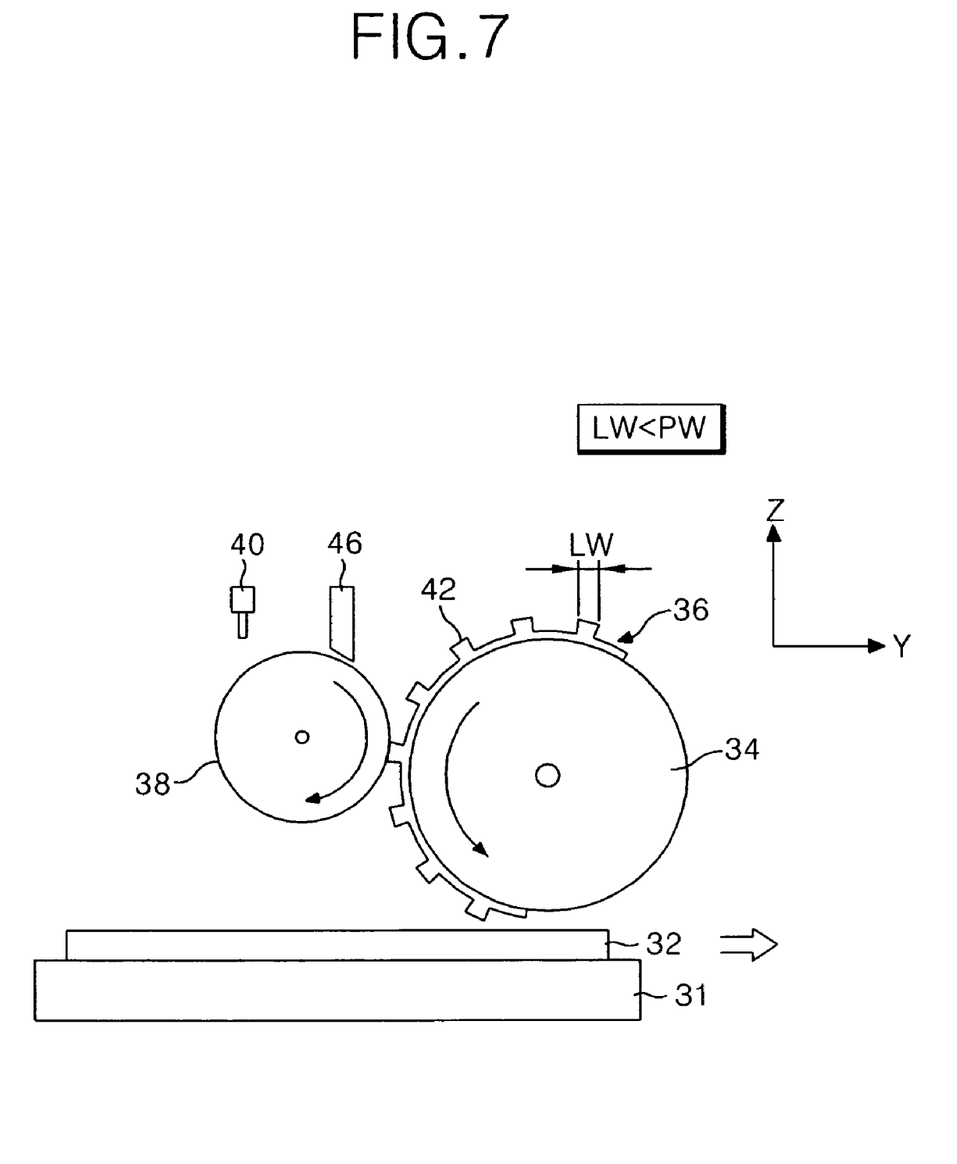
FIG. 7 is a diagram representing a fabricating apparatus of an electro luminescence display device according to the present invention.

FIG. 7 is a diagram representing a fabricating apparatus of an electro luminescence display device according to the present invention.

Referring to FIG. 7, the fabricating apparatus of the electro luminescence display device according to the present invention includes a supply roller 38 on which an EL material is spread, a print roller 34 to which a resin plate 36 for transferring the EL material spread on the surface of the supply roller 38 is attached, and a substrate 32 loaded under the print roller 34.

Each of red R, green G and blue B EL materials is dropped on the supply roller 38 from a dispenser 40 above the supply roller 38. The supply roller 38 is capable of rotating in contact with the resin plate 36 attached to the print roller 34, and acts to spread the EL material applied to supply roller 38 on the resin plate 36. A blade 46 or a roller may be provided close to the surface of the supply roller 38 for the EL material applied to the resin plate 36 to be spread uniformly.

The print roller 34 causes the EL material from the supply roller 38 to be spread on a concave-convex pattern 42 of the resin plate 36 by rotational motion. Further, the print roller 34 causes the concave-convex pattern 42 of the resin plate 36, on which the EL material is spread, to be in contact with the substrate 32 by rotational motion, thereby forming the EL pattern on the substrate 32.

Figure 8:
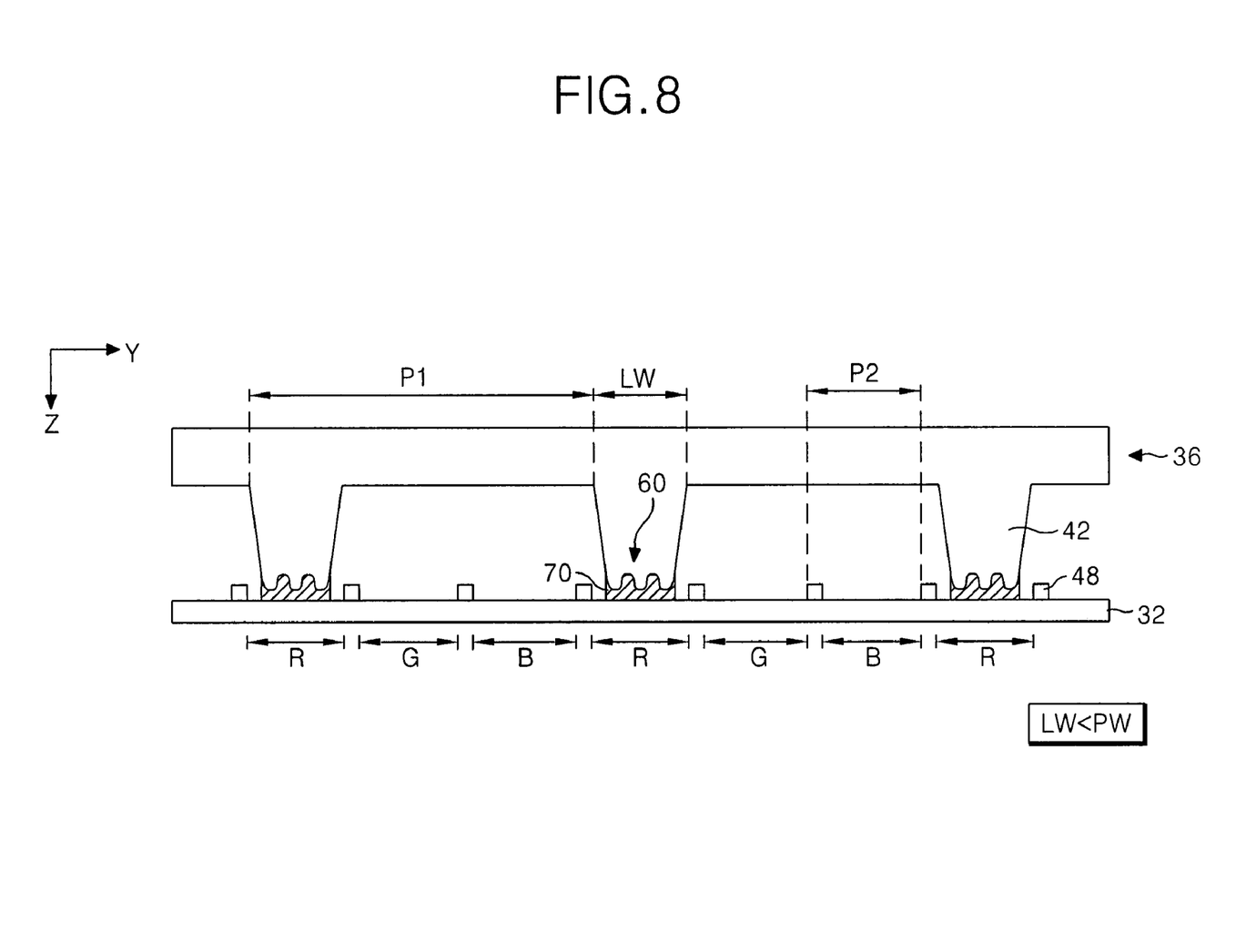
FIG. 8 is a sectional diagram representing a process of transferring an organic EL material to a substrate in use of a concave-convex pattern shown in FIG. 7.

In the resin plate 36, as illustrated in FIG. 8, a concave-convex pattern 42 that has the same shape as the pixel formed on the substrate 32 is provided.

The concave-convex pattern 42 is projected in a stripe shape with a designated gap P1 therebetween. On the surface of the concave-convex pattern 42, there are formed a plurality of hemispherical shape grooves 60. The concave-convex pattern 42 has a width LW of about 20~90% of a corresponding pixel pitch P2, e.g., preferably a width of about 40~60%. Accordingly, the organic EL material 70 spread on the concave-convex pattern 42 is located between the barrier ribs 48 because the barrier ribs 48 become relatively distant from the both ends of the concave-convex pattern 42. At this moment, the organic EL material 70 has relatively higher viscosity than the related art.

The concave-convex pattern 42 is contacted with the supply roller 38 on which the EL material is spread, so the EL material is uniformly spread on the concave-convex pattern 42 with a designated thickness to be transferred onto the substrate 32.

Figure 9A:
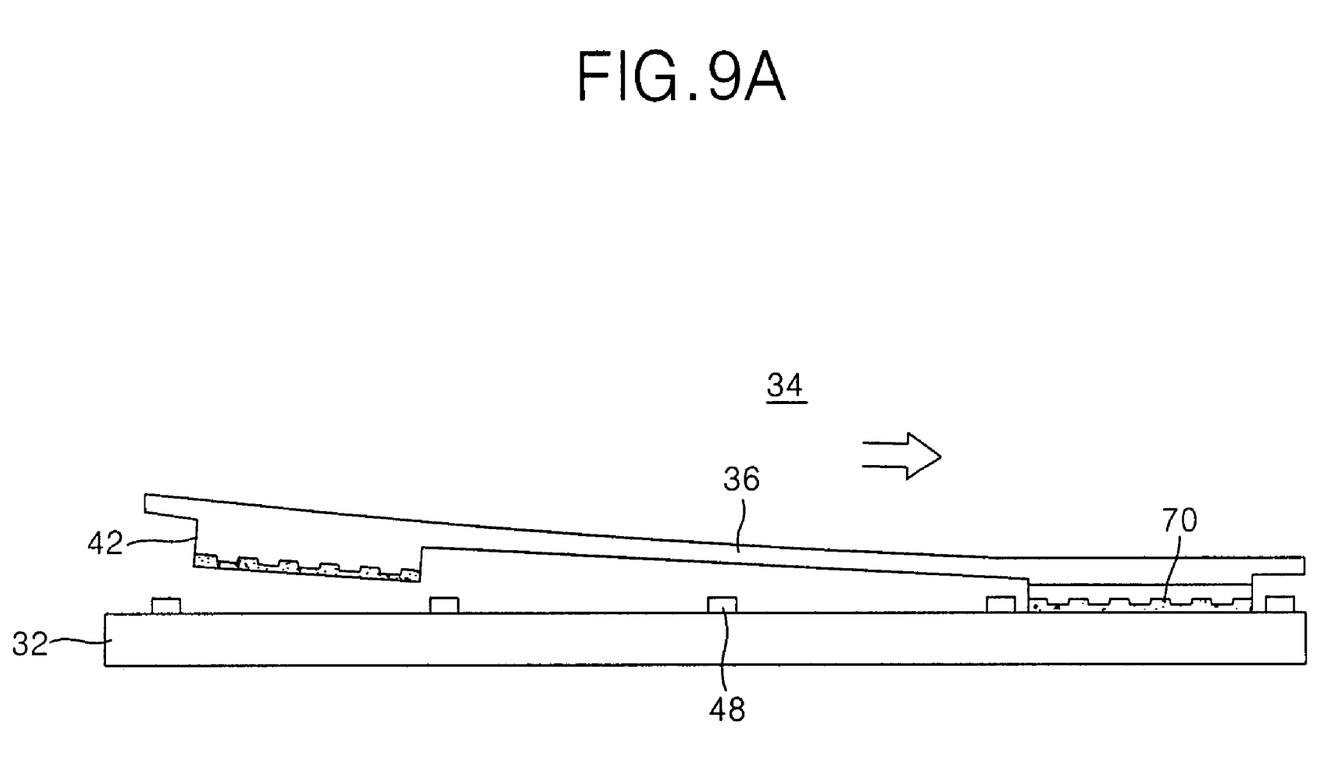
FIGS. 9A to 9C are sectional diagrams representing a step by step process of forming an electro luminescence display device using the fabricating apparatus shown in FIG. 7.
Figure 9B:
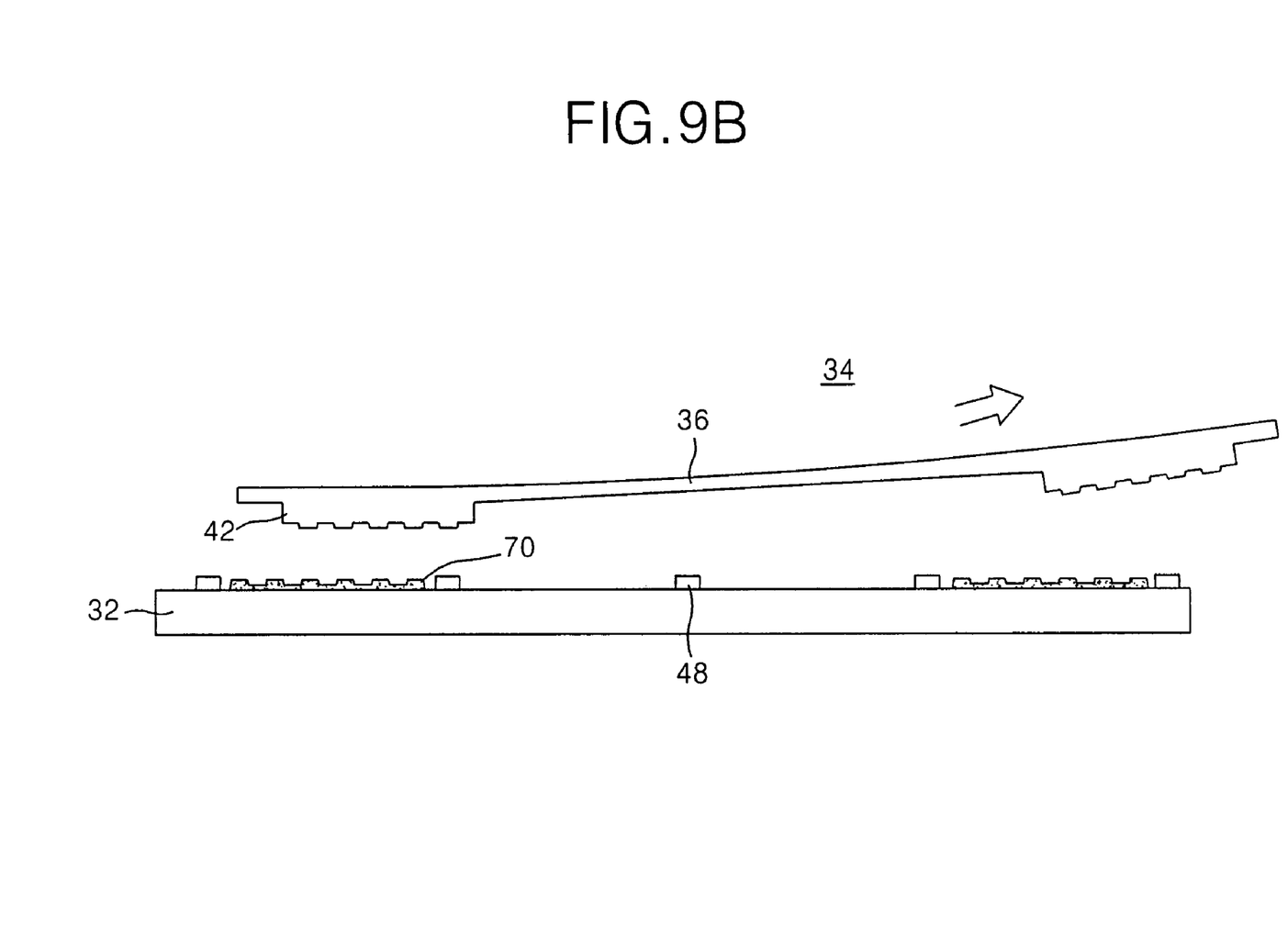
Figure 9C:
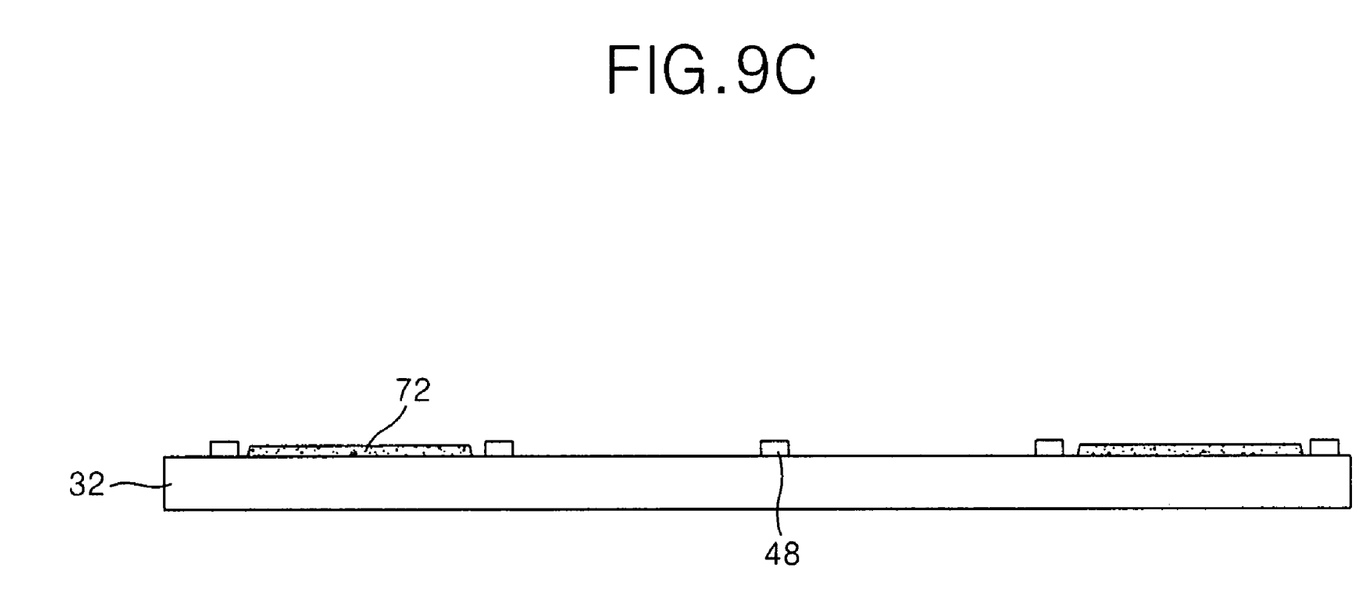

Referring again to FIG. 7 and to FIGS. 9A to 9C a print table 31 having the substrate 32, which is to be printed, is loaded by a loading device (not shown) below the print roller 34. Herein, the substrate 32 can have an electrode pattern and various material layers formed thereon for an EL display device configuration.

Figure 10:
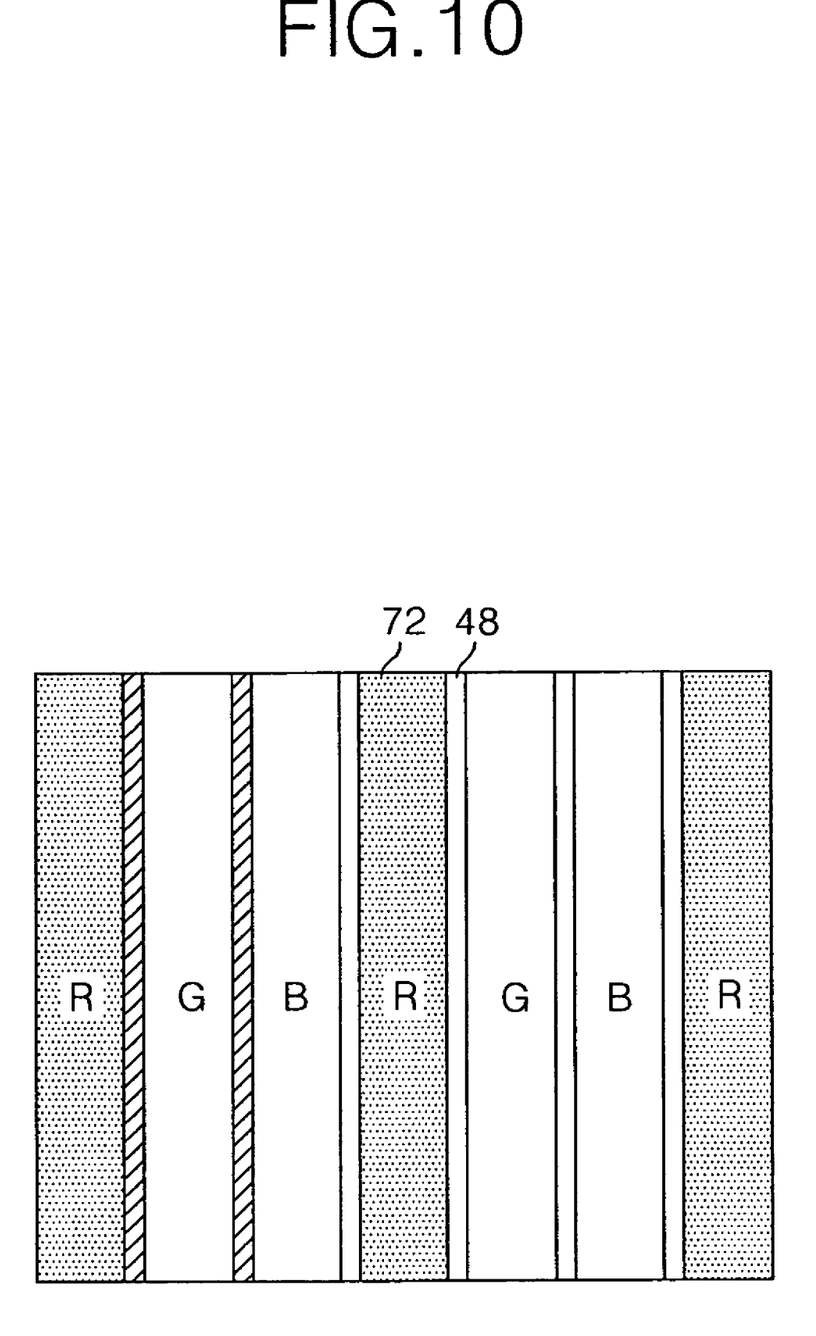
FIG. 10 is a diagram representing a pixel pattern formed on a substrate using the electro luminescence display device shown in FIG. 7.

To describe the operation of the fabricating apparatus of the high polymer organic EL display device of the present invention, the loading device (not shown) loads the substrate 32 that is placed on the print table 31. If the substrate 32 is loaded, the EL material of any one of red, green and blue from the dispenser 40 is applied to the supply roller 38. The EL material is spread on the supply roller 38 to be transferred to the concave-convex pattern 42 of the resin plate 36 by the rotating supply roller 38. At this moment, the print roller 34 working together with the supply roller 38 rotates in the opposite direction to the supply roller 38. The organic EL material spread on the concave-convex pattern 42 of the resin plate 36 is in contact with the substrate 32 located under the print roller 34 by rotation motion. Accordingly, the organic EL material 70 spread on the concave-convex pattern 42 of the resin plate 36, as illustrated in FIG. 9A, is inversely transferred to the substrate 32. At this moment, the width LW of the concave-convex pattern 42 is about 20~90% of one pixel pitch P2, thus the organic EL material 70 does not flow over the adjacent pixels but is inversely transferred only to the corresponding pixel. The concave-convex pattern 42, on which the organic EL material 70 is dropped, as illustrated in FIG. 9B, is separated from the substrate 32 by the rotation of the print roller 34. The organic EL material 70 printed on the substrate 32, as illustrated in FIG. 9C, is changed to be flat on its surface right after being printed. Subsequently, the organic EL material 70 on the substrate 32 is fired at a designated temperature to form the EL pattern 72 on the substrate 32. After forming the EL pattern 72 of a specific color, the same method is used to form EL patterns of other colors. A resulting EL device is illustrated in FIG. 10.

In this way, the fabricating apparatus and method of the electro luminescence display device according to the present invention has the width of the concave-convex pattern formed to be about 20~90% of the pixel pitch. Accordingly, since the barrier ribs formed on the substrate is relatively distant from the concave-convex pattern, the organic EL material spread on the concave-convex pattern and transferred to the substrate can be prevented from flowing over the adjacent pixels. Further, the color purity of the electro luminescence display device is improved.

It will be apparent to those skilled in the art that various modifications and variations can be made in the present invention without departing from the spirit of scope of the invention. Thus, it is intended that the present invention cover the modifications and variations of the invention provided they come within the scope of the appended claims and their equivalents.

What is claimed is:

1. A fabricating apparatus of an electro luminescence display device, comprising:
   a print roller on which an organic material is spread in order to form a light emission layer corresponding to a pixel pattern on a substrate; and
   a concave-convex pattern attached to the print roller, the concave-convex pattern including protrusions each having a width of about 20~90% of a pitch of each pixel of the pixel pattern with a designated gap therebetween.

2. The fabricating apparatus according to claim 1, wherein the width of each protrusion of the concave-convex pattern is about 40~60% of the pitch of each pixel of the pixel pattern.

3. The fabricating apparatus according to claim 1, further comprising a plurality of minute grooves on the surface of the concave-convex pattern.

4. The fabricating apparatus according to claim 1, wherein the print roller includes a supply roller to supply the organic material to the print roller.

5. The fabricating apparatus according to claim 1, further comprising barrier ribs formed on the substrate to partition off each pixel of the pixel pattern.

6. A method of fabricating an electro luminescence display device, comprising:
   adhering a resin plate to a rotating roller, the resin plate having a projected concave-convex pattern wherein each projection of the concave-convex pattern has a width of 20~90% with respect to a Pitch of a pixel of a pixel pattern which is to be formed on a substrate;
   applying an organic material to the resin plate; and
   printing the organic material spread from the resin plate onto the substrate by rotating the roller over the substrate.

7. The fabricating method according to claim 6, wherein the width of each of the projections of concave-convex pattern is about 40~60% of the pitch of each pixel of the pixel pattern.

8. The fabricating method according to claim 6, further comprising forming barrier ribs on the substrate to partition off the pixel patterns.

9. The fabricating method according to claim 6, wherein light emission layers of red, green and blue are formed on the substrate by repeating the adhering step, the applying step and the printing step.

* * * * *